Aug. 15, 1967 J. R. GLASSER 3,336,533
ELECTRONIC CIRCUIT
Filed March 13, 1964
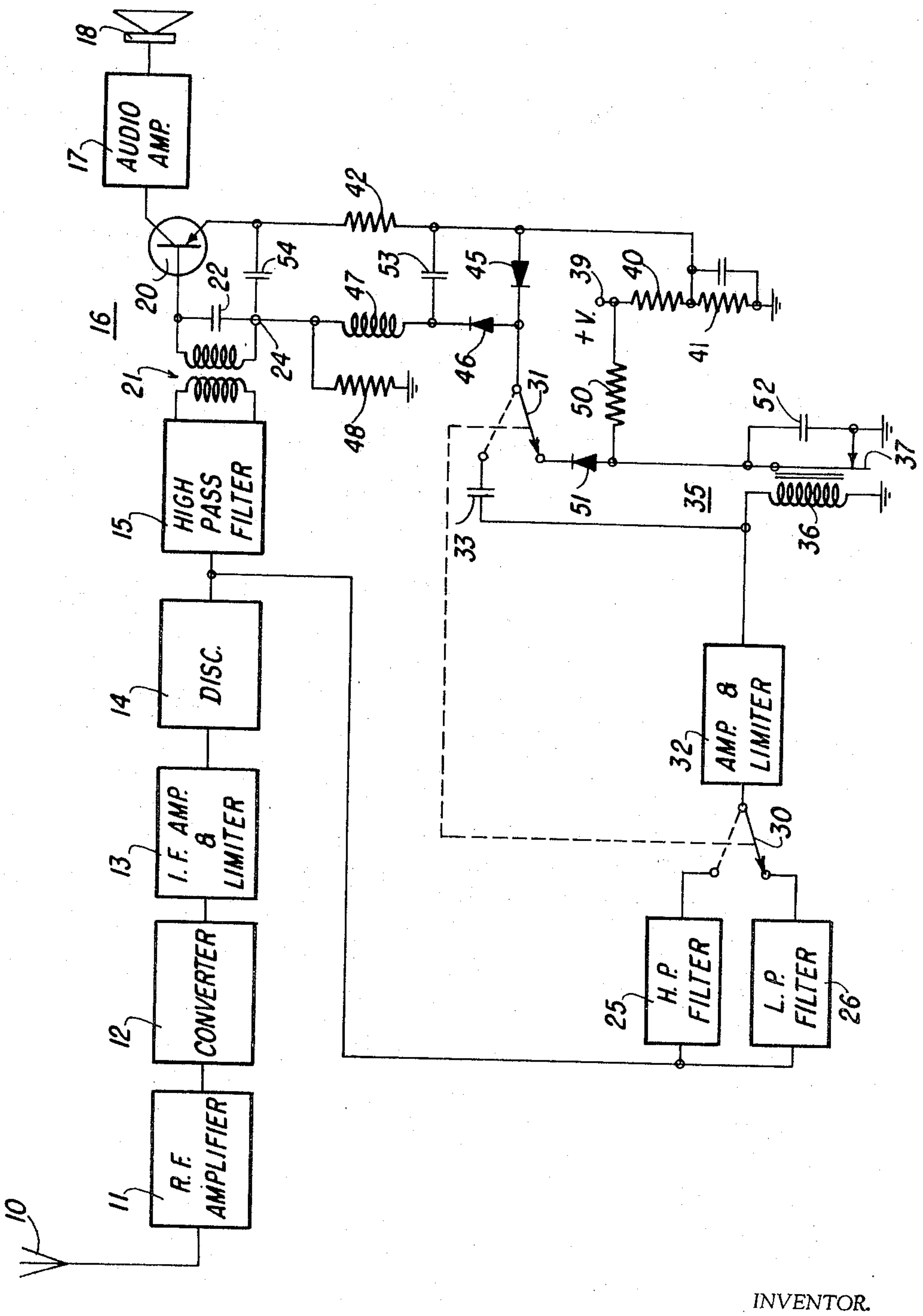
INVENTOR.
James R. Glasser
BY
Mueller & Aichele
Attys.

United States Patent Office 3,336,533
Patented Aug. 15, 1967

3,336,533
ELECTRONIC CIRCUIT

James R. Glasser, Naperville, Ill., assignor to Motorola, Inc., Franklin Park, Ill., a corporation of Illinois
Filed Mar. 13, 1964, Ser. No. 351,806
8 Claims. (Cl. 330—51)

This invention relates generally to audio squelch circuits, and more particularly to an audio squelch circuit which is rendered operative when control signals are applied.

It has been found to be desirable in high gain communication receivers to provide a squelch circuit for cutting off the audio output of the receiver in the absence of a desired signal. Such squelch circuits may operate in response to a modulated carrier wave which reduces the noise in a frequency modulation receiver, or may operate in response to a control or tone signal translated with the desired signal. A system providing both carrier and tone squelch operation is described in Patent No. 3,027,454, issued Mar. 27, 1962 to Donald A. Foecking, and assigned to the assignee of the present invention.

In squelch circuits wherein a tone signal is applied with the desired signal, the tone signal may be used to actuate a frequency responsive reed device to bias an amplifier stage so that it will conduct. In such circuits, a problem has been encountered in that the operation of the contacts of the frequency responsive device produce hum which reaches the audio amplifier through the biasing circuit. A filter may be used to remove the hum, but this increases the cost of the circuit, and will also affect the response time.

It is an object of the present invention to provide an improved audio squelch circuit for a radio receiver which operates in response to a control or tone signal of a particular frequency.

A further object of the invention is to provide a squelch circuit for an audio amplifier which operates in response to a particular control signal applied to a frequency responsive device, and wherein hum produced by the frequency responsive device is isolated from the audio amplifier.

A feature of the invention is the provision of a squelch circuit for a radio receiver including an audio stage which is selectively rendered conducting in accordance with the bias voltage applied thereto, and which includes a reed device and a diode in a bias circuit for rendering the audio stage conductive when the reed device operates, with the diode being cut off when the reed device operates to isolate the reed device from the audio stage.

Another feature of the invention is the provision of a squelch circuit for a radio receiver including a transistor audio amplifier with a bias circuit including first and second diodes across which a voltage drop is developed for holding the transistor amplifier conducting, a third diode applying a potential to the common connection between the two diodes to cut off the transistor audio stage, and a reed device which responds to a control tone of a particular frequency connected to the third diode for cutting off the same so that the transistor amplifier is rendered conducting and the reed device is isolated therefrom by the third diode. The squelch circuit may be switched so that noise signals are applied to a voltage doubler circuit including the first two diodes to cut off the transistor amplifier in the absence of a carrier signal.

The invention is illustrated in the drawing wherein the single figure illustrates a frequency modulation receiver including the squelch circuit of the invention.

The squelch circuit of the invention may be incorporated in a radio receiver of the superheterodyne type for frequency modulation signals. The receiver is used in a communication system wherein tone control signals may be applied with the audio signals. The receiver includes an audio amplifier stage coupled to the discriminator of the receiver through a high pass filter which rejects the low frequency tone signals. The audio amplifier includes a transistor which applies signals to the output of the receiver. Audio signals from the discriminator of the receiver are also applied to the squelch circuit which may include a high pass filter for selecting noise above the audio frequency, and allow pass filter for selecting the tone or control signals in the low audio frequency range. The selected noise signals or the tone signals are amplified and limited and utilized to apply a bias to the transistor audio amplifier to control its conduction. The tone signals are applied to a resonant reed device which responds to signals of a particular frequency. The reed device has contacts which are intermittently closed when the particular frequency is received. The reed contacts are connected in a bias circuit for the transistor amplifier through a diode which is biased to be conducting when the contacts are open. The diode applies a potential to cut off the transistor. When the contacts of the reed device operate, a voltage is applied to the diode to render it non-conducting, and a voltage drop is developed across a pair of diodes in the bias circuit to render the transistor amplifier conducting. The diode therefore isolates the amplifier for hum generated by the contacts of the reed device. The pair of diodes are connected in a circuit to rectify the noise voltage to cut off the amplifier for noise squelch operation.

Referring now to the drawing, the receiver illustrated includes an antenna 10 for applying signals to radio frequency amplifier 11. The amplified RF signals are applied to converter 12 which may include one or more stages of frequency conversion. The reduced frequency signals from converter 12 are applied to intermediate frequency amplifier and limiter 13 wherein the level of the signals is increased to a substantially constant value suitable for detection. The intermediate frequency signals are applied to discriminator 14 which detects the audio modulation therefrom. The detected audio signals are applied to high pass filter 15 which passes signals in the audio range and rejects the low frequency tone signals. Filter 15 may pass signals above 300 cycles per second. The audio signals are amplified in transistor audio amplifier 16 and applied to audio output stage 17 which drives loudspeaker 18.

The audio amplifier 16 includes transistor 20 to which audio signals are applied from high pass filter 15. Input signals are applied through the transformer 21 and across capacitor 22 to the base electrode of transistor 20, and output signals are applied from the collector electrode of the transistor to audio amplifier 17. The transistor 20 is selectively rendered conducting by the potential applied to control terminal 24. The transistor 20 conducts when the potential applied to terminal 24 renders the base electrode of transistor 20 negative with respect to the emitter electrode thereof.

In order to control the conductivity of the audio amplifier 16, a squelch circuit is provided which responds either to the presence of a carrier or to the presence of a control tone, depending upon the position of switches provided in the squelch circuit. The audio output of discriminator 14 is applied to high pass filter 25, which passes signals above the audio frequency being transmitted. The audio frequency band used may include the range from 300 to 3,000 cycles per second, and filter 25 passes frequencies above 3,000 cycles per second. The audio signals are also applied from discriminator 14 to low pass filter 26, which passes low audio frequencies used as control tones in the system. These are preferably frequencies below 300 cycles per second.

Switch 30 selectively connects the output of high pass filter 25, or the output of low pass filter 26, to the amplifier and limiter unit 32 which may include a plurality of stages. This unit will amplify either the noise signals passed by filter 25, or the tone signals passed by filter 26, and includes limiting action to provide a substantially constant output. Switch 30 is ganged with switch 31, and these are shown in the position to provide tone squelch operation. When the switches are in the dotted position, the system provides noise squelch operation.

The output of the amplifier and limiter unit 32 is applied to the coil 36 of a resonant reed unit 35. This reed unit includes a vibrating contact 37 which intermittently engages a fixed contact to provide an intermittently closed circuit. The contacts of the reed unit are connected in a bias circuit for the amplifier stage 16. This includes resistors 40 and 41 which form a voltage divider having an intermediate point connected through resistor 42 to the emitter electrode of transistor 20. A voltage of about 14 volts may be applied to the terminal 39 marked +V and the resistors 40 and 41 may have a value so that the voltage at the intermediate point is of the order of 9 volts. This voltage is applied through resistor 42 to the emitter electrode of transistor 20. This voltage is also applied through diodes 45 and 46, coil 47 and resistor 48 to ground. Because of the voltage drop resulting from the impedance of diodes 45 and 46, the voltage across resistor 48, which is applied to control terminal 24, will be less than the voltage applied to the emitter electrode. Accordingly, the base is at a lower potential than the emitter and transistor 20 will conduct.

As stated above, switch contact 31 is shown in the position for tone squelch operation. The potential from terminal 39 is applied through resistor 50 to capacitor 52 to charge the same. This voltage is applied through diode 51, switch 31, diode 46, coil 47 and resistor 48 to provide a positive potential at terminal 24. As substantially the full voltage at terminal 39 is applied at control terminal 24, the voltage applied to the base electrode of transistor 20 will be greater than the emitter voltage so that transistor 20 will be cut off. Accordingly, when switch 31 is in the solid line position and the reed unit 35 is not operating in response to the control tone, the transistor 20 will be cut off.

When the control tone is received and applied to the coil 36 of reed device 35, the switch contact 37 closes to short the capacitor 52. This brings the anode of diode 51 to ground potential. Inasmuch as the cathode of diode 51 is at a positive voltage, the diode 51 will be rendered non-conducting. This breaks the circuit for the positive voltage through diode 51 to control terminal 24. The positive voltage will be applied to terminal 24 through diodes 45 and 46, but this voltage will be less than the voltage at the emitter of transistor 20 so that the transistor will conduct. When diode 51 becomes non-conducting, it not only renders the transistor 20 conducting, but also isolates the contact 37 of the reed device 35 from the audio amplifier.

In prior circuits, the potential developed at the contacts of the reed device was applied through filters to the base of the trnasistor of the audio amplifier for squelch action. When the reed contact was not vibrating the transistor was non-conducting, and when the reed contact was vibrating a bias voltage was applied therefrom to render the transistor conducting. In such circuits the vibration of the reed contact produced hum which was applied through the bias circuit to the audio transistor, and this provided objectionable disturbances. Although the filter formed by coil 47 and capacitors 53 and 54 would reduce the hum to some extent, it was not completely eliminated. In the circuit of the invention, the diode 51 isolates the potential at the contact of the reed device from the biasing circuit. This permits reduction in the filtering to simplify the circuit, and eliminates the hum as the contacts are completely disconnected when the transistor is rendered conducting.

The isolation of the reed contacts from the bias circuit also reduces problems resulting from deterioration of the reed contacts after prolonged use. Such deterioration of the contacts causes variations in the alternating current voltage produced by operation of the reed contacts to thereby accentuate the hum problem referred to above. The reed contacts may also present increased resistance to change the average voltage developed at the contacts, and when connected to the transistor amplifier this may affect the operation thereof. By isolating the contacts from the amplifier bias circuit, these problems are eliminated.

When switch contacts 30 and 31 are in the dotted positions, the noise passed by filter 25 is amplified and limited in unit 32. The output is applied through capacitor 33 and contact 31 to diodes 45 and 46 which form a voltage doubler rectifier circuit to provide a positive voltage at terminal 24 to cut off transistor 20. When a modulated carrier wave is received, the noise output from amplifier 32 will be reduced so that the voltage at terminal 24 is reduced, and transistor 20 becomes conducting because the potential at the base electrode thereof is less than the emitter potential.

The circuit of the invention provides effective operation both for tone squelch and noise squelch operations. As the voltage drop across diodes 45 and 46 is substantially fixed, no compensation is necessary to retain essentially the same bias voltage with variations in the supply voltage. Further, the diodes 45 and 46 act to compensate the transistor 20 for increased conduction at high temperatures. The tendency of transistor 20 to conduct more base to collector current at high temperatures does not result in increased emitter current because of the characteristics of the diodes 45 and 46.

The squelch circuit of the invention has been found to be very effective as the problem of hum from the reed device is eliminated. The circuit is very simple and eliminates the need of a complex filter for the bias voltage. The same circuit elements are used to provide tone squelch operation and noise squelch operation so that the overall circuit is simple and inexpensive.

I claim:

1. A system for selectively translating audio signals in the presence of control signals of a predetermined frequency including in combination, an audio signal amplifier stage including input and output circuits with said input circuit having a control terminal, said amplifier stage being selectively operative to translate signals from said input circuit thereof to said output circuit thereof in accordance with the voltage at said control terminal, a reed unit having vibrating contact means and a coil for receiving the control signals, said contact means being operative to provide a closed circuit in response to application to said coil of control signals of the predetermined frequency, and a bias circuit connected to said contact means and to said control terminal for applying a bias potential thereto, said bias circuit including a diode coupling said contact means to said control terminal and means applying potentials to said diode to render the same conducting to provide a potential to said control terminal to cut off said amplifier stage, said contact means operating in response to control signals of the predetermined frequency to apply a potential to said diode to render the same non-conducting so that said bias circuit applies a potential to said control terminal to cause said amplifier stage to conduct and to isolate said contact means from said input circuit of said amplifier stage.

2. A system for selectively translating audio signals in the presence of control signals of a predetermined frequency including in combination, an audio signal amplifier stage including input and output circuits with said input circuit having a control terminal, said amplifier stage being selectively operative to translate signals from said input circuit thereof to said output circuit thereof in accordance with the voltage at said control terminal, a reed unit having a coil and vibratory contact means, means for applying the control signals to said coil with said contact means being operative to provide a closed circuit in response to application to said coil of control signals of the predetermined frequency, and a bias circuit connected to said contact means and to said control terminal for applying a bias potential thereto, said bias circuit including means providing a control potential and a diode for applying said control potential to said control terminal to cut off said amplifier stage, said contact means being connected to said control potential means and operating in response to control signals of the predetermined frequency to disable said control potential and cut off said diode so that said amplifier stage conducts, said diode when cut off acting to isolate said contact means from said input circuit of said amplifier stage.

3. A system for selectively translating audio signals in the presence of control signals of a predetermined frequency including in combination, an audio signal amplifier stage including input and output circuits with said input circuit having a control terminal, said amplifier stage being selectively operative to translate signals from said input circuit thereof to said output circuit thereof in accordance with the voltage at said control terminal. a reed unit having a coil and vibrating contact means, means for applying the control signals to said coil with said contact means being operative to provide a closed circuit in response to application to said coil of control signals of the predetermined frequency, and a bias circuit connected to said contact means and to said control terminal for applying a bias potential thereto, said bias circuit including a diode and means providing a control potential to said diode and to said control terminal to cut off said amplifier stage, said contact means being connected to said control potential means and operating in response to control signals of the predetermined frequency to reduce the potential applied to said diode to cut off said diode, said bias circuit applying a potential to said control terminal to render said amplifier stage conducting when said diode is cut off, with said diode when cut off acting to isolate said contact means from said input circuit of said amplifier stage.

4. A system for selectively translating audio signals in the presence of control signals of a predetermined frequency including in combination, an audio signal amplifier stage including input and output circuits with said input circuit having a control terminal, said amplifier stage being selectively operative to translate signals from said input circuit thereof to said output circuit thereof in accordance wtih the voltage at said control terminal, a reed unit having a coil and vibratory contact means, means for applying the control signals to said coil with said contact means being operative to provide a closed circuit in response to control signals of the predetermined frequency, and a bias circuit connected to said contact means and to said control terminal for applying a bias potential thereto, said bias circuit including impedance means across which a voltage drop is developed connected to said control terminal to apply a potential thereto to render said amplifier stage conducting and a diode connected to said impedance means for applying a voltage thereto so that the potential applied to said control terminal cuts off said amplifier stage, said contact means being connected to said diode and operating in response to control signals of the predetermined frequency to cut off said diode so that said amplifier stage conducts, said diode when cut off acting to isolate said contact means from said input circuit of said amplifier stage.

5. A system for selectively translating audio signals in the presence of control signals of a predetermined frequency including in combination, an audio signal amplifier stage including input and output circuits with said input circuit havng a control terminal, said amplifier stage being selectively operative to translate signals from said input circuit thereof to said output circuit thereof in accordance with the voltage at said control terminal, a reed unit having a coil and vibratory contact means, means for applying the control signals to said coil with said contact means being operative to provide a closed circuit in response to control signals of the predetermined frequency, and a bias circuit connected to said contact means and to said control terminal for applying a bias potential thereto, said bias circuit including first diode means across which a voltage drop is developed and connected to said control terminal to apply a potential thereto to render said amplifier stage conducting and second diode means connected to said first diode means for applying a voltage thereto so that a control potential is applied to said control terminal to cut off said amplifier stage, said contact means being connected to said second diode means and operating in response to control signals of the predetermined frequency to cut off said second diode means so that said amplifier stage conducts, said second diode means acting to isolate said contact means from said input circuit of said amplifier stage.

6. A system for translating desired audio signals and which is selectively responsive to control signals of a predetermined frequency and to noise signals which are present in the absence of the desired signals, said system including in combination, an audio signal amplifier stage including input and output circuits with said input circuit having a control terminal, said amplifier stage being selectively operative to translate signals from said input circuit thereof to said output circuit thereof in accordance with the voltage at said control terminal, a reed unit having a coil and vibratory contact means, means operative to apply control signals to said coil with said contact means being operative to provide a closed circuit in response to control signals of the predetermined frequency, and a bias circuit connected to said contact means and to said control terminal for applying a bias potential thereto, said bias circuit including first diode means across which a voltage drop is developed and connected to said control terminal to apply a potential thereto to render said amplifier stage conducting, said diode means, and switch means for connecting said second diode means to said first diode means for applying a voltage thereto so that a control potential is applied to said control terminal to cut off said amplifier stage, said contact means being connected to said second diode means and operating in response to control signals of the predetermined frequency to cut off said second diode means so that said amplifier stage conducts, said second diode means acting to isolate said contact means from said input circuit of said amplifier stage, said switch means having a position for applying noise signals to said first diode means whereby said first diode means applies a potential to said control terminal to cut off said amplifier stage.

7. A system for translating desired audio signals and which is selectively responsive to control signals of a predetermined frequency and to noise signals which are present in the absence of the desired signals, said system including in combination, an audio signal amplifier stage including input and output circuits with said input circuit having a control terminal, said amplifier stage being selectively operative to translate signals from said input circuit thereof to said output circuit thereof in accordance with the voltage at said control terminal, a reed unit having a coil and vibratory contact means, means selectively operative to apply control signals to said coil with said contact means being operative to provide a closed circuit in response to control signals of the predetermined frequency, and a bias circuit connected to said contact means and to said control terminal for applying a bias potential thereto, said bias circuit including first and second diodes connected in series across which a voltage drop is developed and means connecting said diodes to said control terminal to apply a potential thereto to render said amplifier stage conducting, a third diode, and switch means for connecting said third diode to the common connection between said first and second diodes for applying a voltage thereto so that the control potential applied to said control terminal cuts off said amplifier stage, said contact means being connected to said third diode and operating in response to control signals of the predetermined frequency to cut off said third diode so that said amplifier stage conducts, said third diode acting to isolate said contact means from said input circuit of said amplifier, said switch means having a position for applying noise signals to said first and second diodes, said bias circuit connecting said first and second diodes in a voltage doubler circuit which applies a potential to said control terminal to cut off said amplifier stage.

8. A system for translating desired audio signals and which is selectively responsive to control signals of a predetermined frequency and to noise signals which are present in the absence of the desired signals, said system including in combination, an audio signal amplifier stage including input and output circuits with said input circuit having a control terminal, said amplifier stage being selectively operative to translate signals from said input circuit thereof to said output circuit thereof in accordance with the voltage at said control terminal, a reed unit having a coil and vibratory contact means, means selectively operative to apply control signals to said coil with said contact means being operative to provide a closed circuit in response to control signals of the predetermined frequency, and a bias circuit connected to said contact means and to said control terminal for applying a bias potential thereto, said bias circuit including first voltage supply means and first and second diodes connected in series from said first voltage supply means to said control terminal to apply a potential thereto to render said amplifier stage conducting, second voltage supply means providing a higher potential than said first voltage supply means, a third diode, and means including switch means for connecting said second voltage supply means through said third and second diodes to said control terminal for applying thereto a voltage to cut off said amplifier stage, said contact means being connected to said third diode and operating in response to control signals of the predetermined frequency to apply potentials to said third diode to cut off the same so that said amplifier stage conducts, said third diode acting to isolate said contact means from said input circuit of said amplifier, said switch means having a position for applying noise signals to said first and second diodes, said bias circuit connecting said first and second diodes in a voltage doubler circuit which applies a potential to said control terminal to cut off said amplifier stage.

No references cited.

KATHLEEN H. CLAFFY, *Primary Examiner.*

R. LINN, *Assistant Examiner.*